United States Patent
Jun et al.

[11] Patent Number: 6,112,310
[45] Date of Patent: Aug. 29, 2000

[54] TECHNIQUE FOR GENERATING MEMORY CLOCK IN VIDEO CONTROLLER

[75] Inventors: Dae-hyun Jun; Seung-ho Park, both of Suwon, Rep. of Korea

[73] Assignee: SamSung Electronics Co., Ltd., Suwon, Rep. of Korea

[21] Appl. No.: 09/152,502

[22] Filed: Sep. 14, 1998

[30] Foreign Application Priority Data

Sep. 12, 1997 [KR] Rep. of Korea ............ 97-47213

[51] Int. Cl.[7] .................... G06F 1/04; G06F 1/12
[52] U.S. Cl. .............................. 713/501; 713/400
[58] Field of Search .................... 713/100, 300, 713/400, 401, 500, 501

[56] References Cited

U.S. PATENT DOCUMENTS

| | | | |
|---|---|---|---|
| 4,819,164 | 4/1989 | Branson | 713/501 |
| 4,893,271 | 1/1990 | Davis et al. | 713/501 |
| 5,378,935 | 1/1995 | Korhonen et al. | 327/114 |
| 5,392,435 | 2/1995 | Masui et al. | 710/260 |
| 5,513,340 | 4/1996 | Kowert | 713/501 |
| 5,524,249 | 6/1996 | Suboh | 713/322 |
| 5,615,376 | 3/1997 | Ranganathan | 713/322 |
| 5,619,707 | 4/1997 | Suboh | 713/322 |
| 5,623,647 | 4/1997 | Maitra | 713/501 |
| 5,630,145 | 5/1997 | Chen | 713/322 |
| 5,758,133 | 5/1998 | Evoy | 713/501 |
| 5,771,373 | 6/1998 | Kau et al. | 713/500 |
| 5,774,704 | 6/1998 | Williams | 713/501 |
| 5,781,768 | 7/1998 | Jones, Jr. | 713/501 |
| 5,951,661 | 9/1999 | Tavallaei et al. | 710/105 |

*Primary Examiner*—Joseph E. Palys
*Assistant Examiner*—Ronald D Hartman, Jr.
*Attorney, Agent, or Firm*—Robert E. Bushnell, Esq.

[57] ABSTRACT

A video controller for automatically varying a memory clock frequency according to the number of commands of controlling a memory includes: a video memory for storing image data to be transmitted to a monitor, a bus interface for receiving commands transmitted from a central processing unit (CPU) through a host bus, a controller for generating an address, data and a control signal for controlling reading from and writing into the video memory according to the commands received from the bus interface, a frequency setter for variably setting a memory clock frequency for accessing a video memory according to an occupancy rate of video access cycles with respect to total bus cycles, and a frequency generator for generating a memory clock according to the memory clock frequency set by the frequency setter. When the number of memory access cycles increases, the memory clock frequency increases to improve the performance of the system and when the number of memory access cycles is reduced, the memory clock frequency is also reduced, to minimize power consumption of the chip.

12 Claims, 4 Drawing Sheets

TECHNIQUE FOR GENERATING MEMORY CLOCK IN VIDEO CONTROLLER

CLAIM OF PRIORITY

This application makes reference to, incorporates the same herein, and claims all benefits accruing under 35 U.S.C. §119 from an application for METHOD FOR GENERATING MEMORY CLOCK IN VIDEO CONTROLLER AND APPARATUS THEREFOR earlier filed in the Korean Industrial Property Office on the 12$^{th}$ of September 1997 and there duly assigned Ser. No. 47213/1997.

BACKGROUND OF THE INVENTION

1. Field of the Invention

The present invention relates to a computer system having a PCI/AGP bus, and more particularly, to a video controller for automatically changing a memory clock frequency according to the number of memory control commands per unit time.

2. Description of the Related Art

In a video controller of a typical computer system, a video memory stores image data to be transmitted to a monitor. A bus interface receives transmitted commands, e.g., a control signal, data or an address signal of a central processing unit (CPU), through a host bus, and transmits the received commands to a sequential controller. The sequential controller generates an address, data and a control signal for controlling read and write with respect to the video memory to transmit the generated address, data and control signal to the video memory The control signal includes a column address strobe (CAS), a row address strobe (RAS), a write enable (WE) and an output enable (OE). A frequency synthesizer generates clock signals including a memory clock and a pixel clock. A BIOS ROM includes a BIOS code for controlling all devices, where the code is read during initializing of the device.

The CPU must periodically read a video memory to refresh a screen of the monitor, and the system performance speed deteriorates when data transmission to the video memory from the CPU increases. However, a memory clock used for controlling timing of the memory is once programmed by a bios during initializing of a video controller chip. Thus, even though the number of CPU commands is increases or decreases, the clock frequency is not changed, so that the frequency of the memory clock is constant without change regardless of a load level concerning transmission of data from the CPU to the video memory.

In the above-described memory controller, the frequency of the memory clock is set to a maximum operating frequency for a system. However, during the use of the computer, data is not always transmitted from the CPU to the memory, thereby causing a high power consumption and the generation of EMI due to the use of a high-frequency signal.

The following patents each discloses features in common with the present invention: U.S. Pat. No. 4,893,271 to Davis et al., entitled *Synthesized Clock Microcomputer With Power Saving*, U.S. Pat. No. 5,615,376 to Ranganathan, entitled *Clock Management For Power Reduction In A Video Display Sub-System*, U.S. Pat. No. 5,774,704 to Williams, entitled *Apparatus And Method For Dynamic Central Processing Unit Clock Adjustment*, U.S. Pat. No. 5,781,768 to Jones Jr., entitled *Graphics Controller Utilizing A Variable Frequency Clock*, U.S. Pat. No. 5,524,249 to Suboh, entitled *Video Subsystem Power Management Apparatus And Method*, U.S. Pat. No. 5,623,647 to Maitra, entitled *Application Specific Clock Throttling*, U.S. Pat. No. 5,619,707 to Suboh, entitled *Video Subsystem Power Management Apparatus And Method*, U.S. Pat. No. 5,758,133 to Evoy, entitled *System And Method For Altering Bus Speed Based On Bus Utilization*, U.S. Pat. No. 5,392,435 to Masui et al., entitled *Microcomputer Having A System Clock Frequency That Varies In Dependence On The Number Of Nested And Held Interrupts*, and U.S. Pat. No. 5,771,373 to Kau et al., entitled *Power Management Masked Clock Circuitry, Systems And Methods*.

SUMMARY OF THE INVENTION

To solve the above problems, it is an objective of the present invention to provide a technique for automatically changing a frequency of a memory clock according to the number of cycles per unit time for accessing a video memory in a video controller.

It is another objective of the present invention to provide a video controller including a memory clock generator for changing a memory clock frequency.

To achieve one objective, a method of generating a memory clock for accessing a video memory in a video controller includes the steps of:

a) counting the number of total bus cycles for a predetermined time period;

b) counting the number of video memory access cycles which read from or write into the video memory for the predetermined time period;

c) determining an occupancy rate of the counted video memory access cycles with respect to the counted total bus cycles;

d) setting a memory clock frequency according to the occupancy rate; and e) generating a memory clock according to the set memory clock frequency.

To achieve one objective, a memory clock frequency generator in a video controller includes: a total cycle counting unit for counting the number of total bus cycles; a memory cycle counting unit for determining whether a cycle is a video memory access cycle which reads from or writes into a video memory, so as to count the number of memory access cycles; a time setting unit for resetting counted values of the total cycle counting unit and the memory cycle counting unit in a predetermined time period; an occupancy rate determiner for determining an occupancy rate of the video memory access cycles with respect to the total bus cycles in the predetermined time period set by the time setting unit; a frequency setting unit for variably setting a memory clock frequency according to the occupancy rate; and a frequency generator for generating a memory clock according to the memory clock frequency set by the frequency setting unit.

To achieve another objective, a video controller includes: a video memory for storing image data to be transmitted to a monitor; a bus interface for receiving commands transmitted from a central processing unit (CPU) through a host bus; a controller for generating an address, data and a control signal for controlling reading from and writing into the video memory according to the commands received from the bus interface; a frequency setter for variably setting a memory clock frequency for accessing a video memory according to an occupancy rate of video access cycles with respect to total bus cycles; and a frequency generator for generating a memory clock according to the memory clock frequency set by the frequency setter.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF THE PREFERRED EMBODIMENTS

Figure 1:
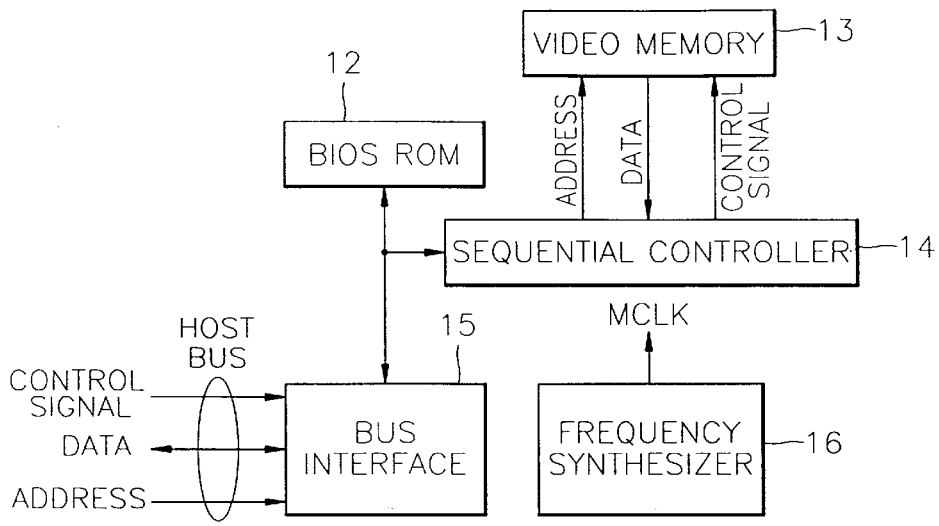
FIG. 1 is a block diagram of a video controller of an earlier computer system.

FIG. 1 is a block diagram of the video controller discussed in the Description of the Related Art above. The video memory 13 stores image data to be transmitted to a monitor. A bus interface 15 receives transmitted commands through a host bus and transmits the received commands to a sequential controller 14. A frequency synthesizer 16 generates clock signals including a memory clock and a pixel clock. A BIOS ROM 12 includes a BIOS code for controlling all devices where the code is read during initializing of the device.

Figure 2:
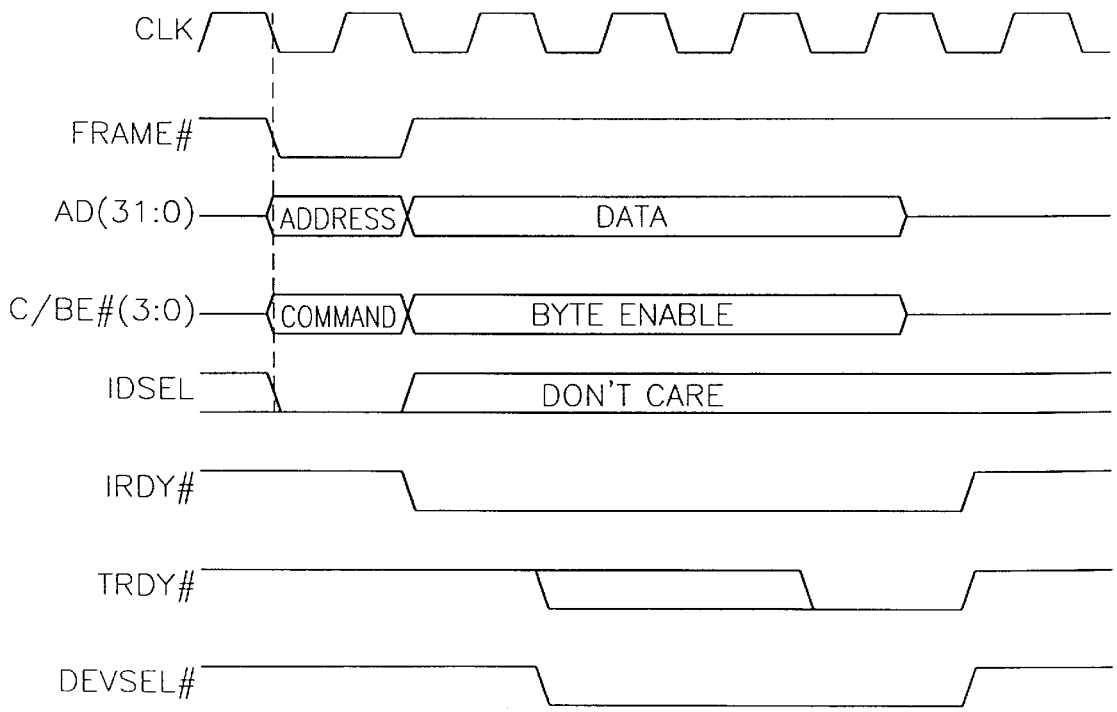
FIG. 2 is a PCI bus timing diagram related to a memory controller.

Referring to FIG. 2, CLK is a bus timing reference signal. FRAME# is a cycle frame signal which is driven by a current master to indicate the beginning and duration of an access. Thus, the FRAME# is asserted to indicate the beginning of a bus transaction, and the transaction is in its final data phase when the FRAME# is deasserted. AD(31:0) is a bidirectional address/data signal for transmitting a system address and data during a memory read and write or a data input and output.

C/BE#(3:0) is a command/byte enable signal for transmitting bus commands or byte enables. C/BE# defines the bus commands as shown in Table 1 during an address phase of the operation, and generates the memory read/write commands when the video controller is a bus master. The C/BE#(3:0) is used as the byte enable during a data phase.

TABLE 1

| CBE(3:0)# | Command Type |
|---|---|
| 0 2 h (0 0 1 0) | I/O read |
| 0 3 h (0 0 1 1) | I/O write |
| 0 6 h (0 1 1 0) | Memory read |
| 0 7 h (0 1 1 1) | Memory write |
| 0 A h (1 0 1 0) | Configuration read |
| 0 B h (1 0 1 1) | Configuration write |

IDSEL in a PCI mode operates as a chip select input signal during configuration read and write cycles, and IDSEL in an AGP mode operates as an input signal for strobing data of AD(31:16) and C/BE(3:2)#. DEVSEL#, a device select signal, is an input/output pin, where the output therefrom is driven active-low when the video controller has decoded the address as a target of the current access, and this pin is an input pin when the video controller is a bus master. Also, a data mode is completed in a clock cycle in which IRDY# and TRDY# are asserted.

As shown in Table 1, a memory access cycle occurs when the C/BE# 06h(0110) and 07h(0111), i.e., when (C/BE#3 C/BE#2 C/BE#1)=(011), and if DEVSEL# is driven next clock, it is confirmed that the cycle is a memory access cycle.

Figure 3:
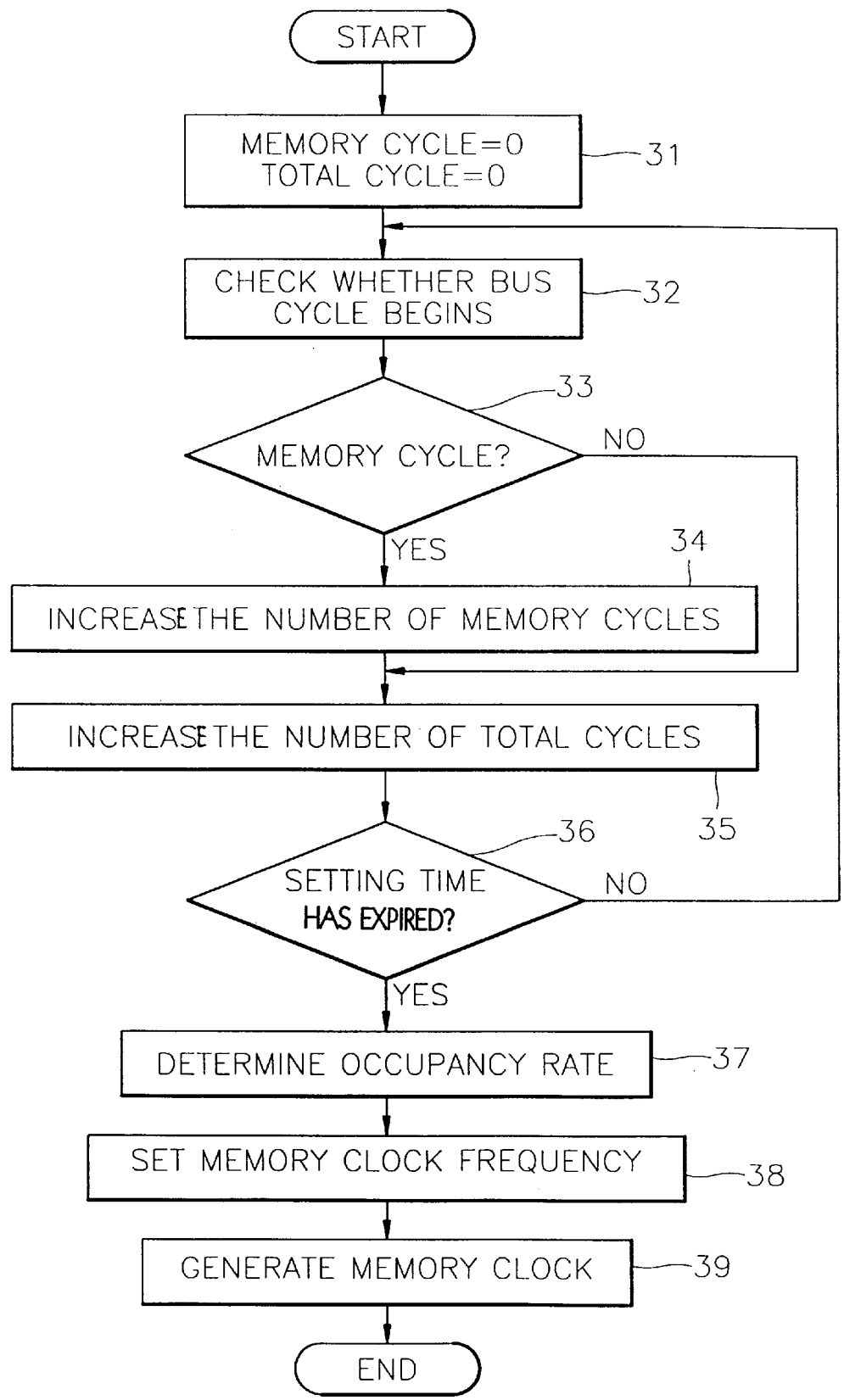
FIG. 3 is a flowchart illustrating a method of generating a memory clock in a video controller according to the present invention.

Referring to FIG. 3, the flowchart explains a process of setting a predetermined time interval and generating a memory clock for accessing a video memory in the unit of the time interval, This process is repeated in each time interval.

The numbers of total bus cycles and memory cycles are initialized to zero (step 31), and then it is checked whether the bus cycle begins (step 32). It is checked whether the bus cycle is a memory access cycle for reading from or writing into a video memory (step 33). If so, the number of the video memory access cycles is increased by one (step 34). Also, the number of the total bus cycles is increased by one in every bus cycle (step 35).

It is checked whether a predetermined time has expired (step 36), and if not, the bus cycle is checked again to count-up the number of the memory access cycles and the number of total bus cycles (steps 32 to 35). If expired, an occupancy rate of the video memory access cycles with respect to the total bus cycles during the predetermined time period is determined (step 37). A memory clock frequency is variably set according to the occupancy rate (step 38), and the memory clock is generated according to the memory clock frequency set in step 38 (step 39).

Here, in step 35 of counting the number of total cycles, the FRAME# asserted in beginning of the bus cycle and deasserted in finishing thereof is counted to determine the number of occurrences of total cycles. In step 38 of setting the memory clock frequency, an initial memory clock frequency may be set to a predetermined maximum frequency or an intermediate value of the maximum frequency, and the memory clock frequency is increased or reduced in proportion to the measured occupancy rate.

The above-described steps are illustrated by a case which may variably set the memory clock frequency in a unit of 16 bus cycles. That is, the number of memory access cycles among a first 16 bus cycles is stored in a first register, and then the number of the memory access cycles among a second 16 bus cycles is stored in a second register. When a value of the second register is higher than that of the first register, the clock frequency is increased and if not, it is reduced, corresponding to a difference in values therebetween. The clock frequency may be varied only when the difference is more than a predetermined value, e.g., 4 or more.

Figure 4:
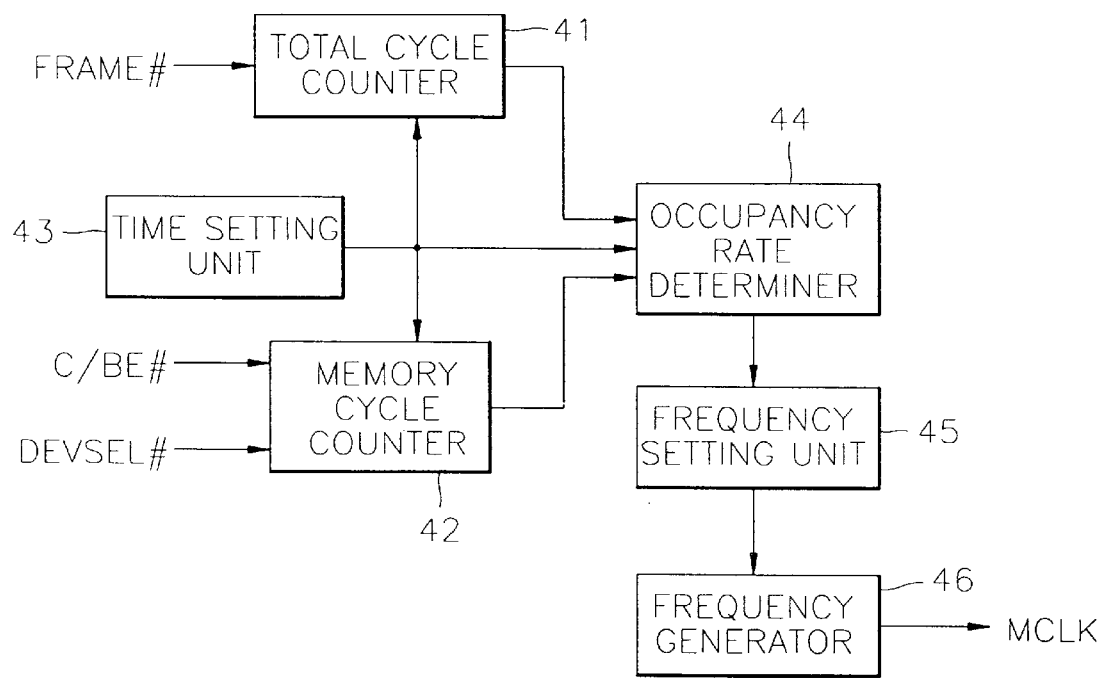
FIG. 4 is a block diagram of a memory clock generator in the video controller according to the present invention.

Referring to FIG. 4, a total cycle counter 41 receives the FRAME# which is asserted in the beginning of the bus cycle and deasserted in the finishing thereof, to count the number of the pulses and thus number of the total bus cycles.

The memory cycle counter 42 checks whether a cycle is a video memory access cycle for reading from or writing into a video memory, to count the number of memory access cycles. The memory cycle counter 42 receives the C/BE# for defining the bus command and the DEVSEL# which is driven active-low when the video controller decodes the address to a target of the current access, to count the number of the memory access cycles according to a signal state. When the upper 3-bits of C/BE# are "011", the current cycle is a memory read/write cycle. Thus, the memory cycle counter 42 is easily implemented by a logic circuit for receiving 3-bit data and a counter. Also, the DEVSEL# may be checked again to re-check whether or not the memory access cycle occurs.

A time setting unit 43 resets counted values of the total cycle counter 41 and the memory cycle counter 42 in a predetermined time period. For example, the time period can be set by the time corresponding to an arbitrary number of bus cycles, for example, 16 bus cycles.

An occupancy rate determiner 44 determines the occupancy rate of the video memory access cycles with respect to the total bus cycles in a predetermined time period set by the time setting unit 43. A frequency setting unit 45 varies and sets the frequency of the memory clock according to the occupancy rate. The frequency setting unit 45 sets an initial memory clock frequency to a predetermined maximum frequency or to an intermediate value of the maximum frequency, and then increases or reduces the memory clock frequency in a predetermined time period in proportion to an increase or decrease in a measured occupancy rate. That is, when the occupancy rate is 100%, the memory clock frequency is set to the maximum frequency, and when 80% and 30%, it is set to 80% and 30% of the maximum frequency, respectively. The frequency may be set in an arbitrary rate appropriate for system performance, and not in direct proportion. A frequency generator 46 generates a memory clock MCLK according to the memory clock frequency set by the frequency setting unit 45.

Figure 5:
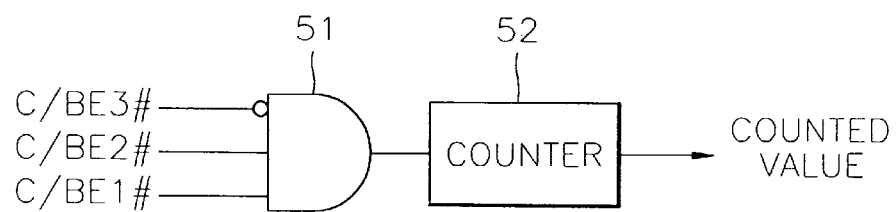
FIG. 5 shows an example of forming a memory cycle counter 42.

Referring to FIG. 5, an OR circuit 51 OR-operates C/BE1#, C/BE2# and inverted C/BE3# bits, and a counter 52 increases a count value by one when the output of the OR circuit 51 is a logic high.

Figure 6:
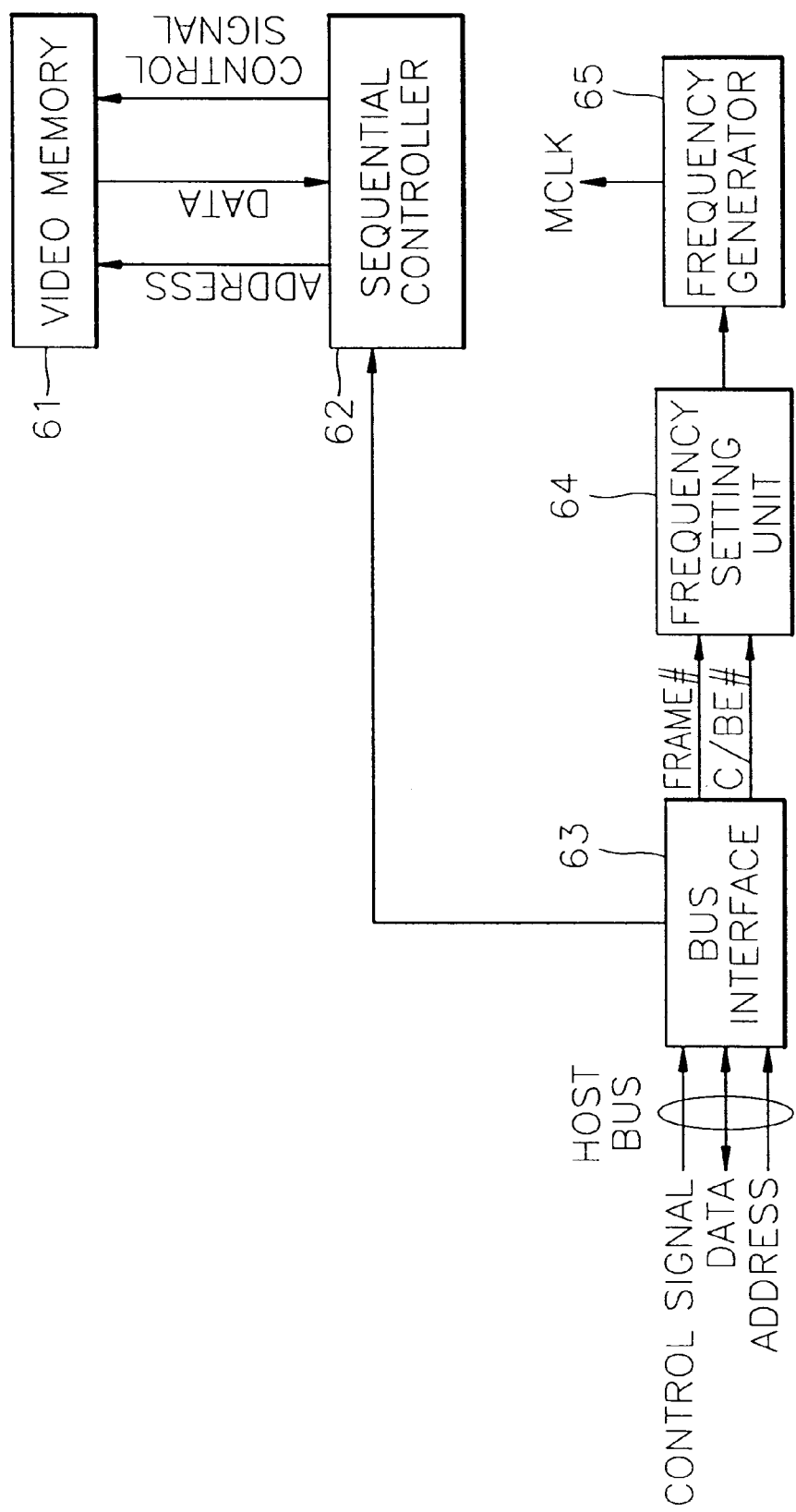
FIG. 6 is a block diagram of a video controller having a memory clock generator according to the present invention.

Referring to FIG. 6, a video memory 61 stores image data to be transmitted to a monitor. A bus interface 63 receives commands transmitted from a central processing unit (CPU, not shown) through a host bus, and transmits signals to a sequential controller 62 and a frequency setting unit 64. The sequential controller 62 generates an address, data and a control signal for controlling reading from and writing into the video memory according to the command signal received from the bus interface 63.

The frequency setting unit 64 receives FRAME# and C/BE# from the bus interface 62, and variably sets a frequency of a memory clock for a video memory access according to the occupancy rate of the video memory access cycles with respect to a total bus cycles in a predetermined time period, as described above. The frequency setting unit 65 generates a memory clock MCLK according to a memory clock frequency set by the frequency setting unit 64.

According to a method for generating a memory clock in a video controller of the present invention and an apparatus therefor, when the load of a system increases, the memory clock frequency maximally increases, and when the load reduces, the memory clock frequency is also reduced. Thus, when the number of memory access cycles increases, the memory clock frequency increases to improve the performance of the system, and when the number of memory access cycles is reduced, the memory clock frequency is also reduced, to thereby minimize power consumption of the chip.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for generating a memory clock for accessing a video memory in a video controller, comprising the steps of:
    a) counting a number of total bus cycles for a predetermined time period;
    b) counting a number of video memory access cycles which read from or write into the video memory during said predetermined time period;
    c) determining an occupancy rate of the counted video memory access cycles with respect to the counted total bus cycles;
    d) setting a memory clock frequency according to the occupancy rate; and
    e) generating a memory clock according to the set memory clock frequency.

2. The method of claim 1, further comprising counting frame signals asserted in a beginning of a bus cycle and deasserted in a finishing thereof to determine the number of total cycles per time period, in step a) of counting the number of total bus cycles.

3. The method of claim 1, further comprising setting an initial memory clock frequency to a predetermined maximum frequency, and increasing or decreasing the memory clock frequency in the predetermined time period in proportion to an increase or a decrease in the occupancy rate, in step d) of setting a memory clock frequency.

4. The method of claim 1, further comprising setting an initial memory clock frequency to an intermediate value of a predetermined maximum frequency, and increasing or decreasing the memory clock frequency in the predetermined time period in proportion to an increase or a decrease in the occupancy rate, in step d) of setting a memory clock frequency.

5. The method of claim 1, the predetermined time period corresponding to 16 bus cycles.

6. A memory clock generator for accessing a video memory in a video controller comprising:
    a total cycle counting unit for counting a number of total bus cycles;
    a memory cycle counting unit for determining whether a cycle is a video memory access cycle which reads from or writes into a video memory, and for counting a number of memory access cycles;
    a time setting unit for resetting the counted number of the total cycle counting unit and the memory cycle counting unit in a predetermined time period;
    an occupancy rate determiner for determining an occupancy rate of the video memory access cycles with respect to the total bus cycles in the time period set by the time setting unit;
    a frequency setting unit for variably setting a memory clock frequency according to the occupancy rate; and
    a frequency generator for generating a memory clock according to the memory clock frequency set by the frequency setting unit.

7. The memory clock generator of claim 6, the total cycle counting unit counting a frame signal asserted in a beginning of a bus cycle and deasserted in a finishing thereof.

8. The memory clock generator of claim 6, the frequency setting unit setting an initial memory clock frequency to a predetermined maximum frequency, and increasing or decreasing the memory clock frequency in the predetermined time period in proportion to an increase or decrease in the occupancy rate.

9. The memory clock generator of claim 6, the frequency setting unit setting an initial memory clock frequency to an intermediate value of the maximum frequency, and increasing and decreasing the memory clock frequency in the predetermined time period in proportion to an increase or decrease in the occupancy rate.

10. The memory clock generator of claim 6, the time setting unit setting the predetermined time period to a time interval corresponding to 16 bus cycles.

11. A video controller comprising:
    a video memory for storing image data to be transmitted to a monitor;

a bus interface for receiving commands transmitted from a central processing unit (CPU) through a host bus;

a controller for generating an address, data and a control signal for controlling operation of reading from and writing into the video memory according to the commands received from the bus interface;

a frequency setting means for variably setting a memory clock frequency for accessing a video memory according to an occupancy rate of video access cycles with respect to total bus cycles; and a frequency generator for generating a memory clock according to the memory clock frequency set by the frequency setting means.

12. The video controller of claim 11, the frequency setting means comprising:

a total cycle counting means for counting the number of total bus cycles;

a memory cycle counting means for determining whether a cycle is a video memory access cycle which reads from or writes into a video memory, and for counting the number of memory access cycles;

a time setting means for resetting the counted number of the total cycle counting means and the memory cycle counting means, in a predetermined time period;

an occupancy determining means for determining an occupancy rate of the video memory access cycles with respect to the total bus cycles, in the predetermined time period of the time setting means; and a frequency setting means for setting a memory clock frequency for accessing a video memory according to the occupancy rate.

* * * * *